(12) United States Patent
Fuergut et al.

(10) Patent No.: US 10,125,012 B2
(45) Date of Patent: Nov. 13, 2018

(54) MEMS DEVICE

(71) Applicant: Infineon Technologies AG, Neubiberg (DE)

(72) Inventors: Edward Fuergut, Dasing (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/011,621

(22) Filed: Aug. 27, 2013

(65) Prior Publication Data
US 2015/0061045 A1    Mar. 5, 2015

(51) Int. Cl.
B81B 7/00 (2006.01)
B81C 1/00 (2006.01)

(52) U.S. Cl.
CPC .......... *B81B 7/007* (2013.01); *B81C 1/00238* (2013.01); *B81C 1/00301* (2013.01); *B81B 2207/07* (2013.01); *B81B 2207/091* (2013.01); *H01L 2224/16225* (2013.01)

(58) Field of Classification Search
CPC .... B81B 7/007; B81B 7/0061; H03H 9/1057; B81C 2203/0109; H01L 21/56; H04R 31/006; H04R 2499/15
USPC ......... 257/416, 415, 678, E21.002, E29.324; 438/51
See application file for complete search history.

(56) References Cited

U.S. PATENT DOCUMENTS

| | | | |
|---|---|---|---|
| 6,522,762 B1* | 2/2003 | Mullenborn | H04R 19/005 367/181 |
| 8,169,041 B2 | 5/2012 | Pahl et al. | |
| 2004/0120540 A1 | 6/2004 | Mullenborn et al. | |
| 2005/0144968 A1* | 7/2005 | Shakespeare | 62/298 |
| 2006/0163680 A1* | 7/2006 | Chen | A61M 37/00 257/416 |
| 2007/0114623 A1* | 5/2007 | Kuisma | B81C 1/0023 257/415 |
| 2011/0156178 A1 | 6/2011 | Zuniga-Ortiz et al. | |
| 2012/0280335 A1 | 11/2012 | Zoellin et al. | |
| 2013/0119492 A1* | 5/2013 | Feiertag | B81C 1/00238 257/416 |
| 2013/0126991 A1 | 5/2013 | Ehrenpfordt et al. | |
| 2013/0140655 A1* | 6/2013 | Yeh | H01L 21/56 257/416 |
| 2014/0091420 A1* | 4/2014 | Payne | H01L 27/14601 257/443 |

FOREIGN PATENT DOCUMENTS

| | | | |
|---|---|---|---|
| CN | 101155437 A | 4/2008 | |
| CN | 101459866 A | 6/2009 | |
| CN | 102640285 A | 8/2012 | |

(Continued)

*Primary Examiner* — Mouloucoulaye Inoussa
(74) *Attorney, Agent, or Firm* — Slater Matsil, LLP

(57) ABSTRACT

A MEMS device includes a first chip and a MEMS chip. The first chip has a mounting surface and includes at least an integrated circuit. The MEMS chip has a main surface on which a first set of contact pads for contacting the MEMS device and a second set of contact pads for contacting the first chip are arranged. The first chip is mechanically attached and electrically connected to the second set of contact pads via the mounting surface facing the main surface. The mounting surface of the first chip is at least 25% smaller than the main surface of the MEMS chip.

19 Claims, 8 Drawing Sheets

(56) References Cited

FOREIGN PATENT DOCUMENTS

| | | |
|---|---|---|
| CN | 202679629 U | 1/2013 |
| CN | 103130176 A | 6/2013 |
| KR | 20110091158 A | 8/2011 |

* cited by examiner

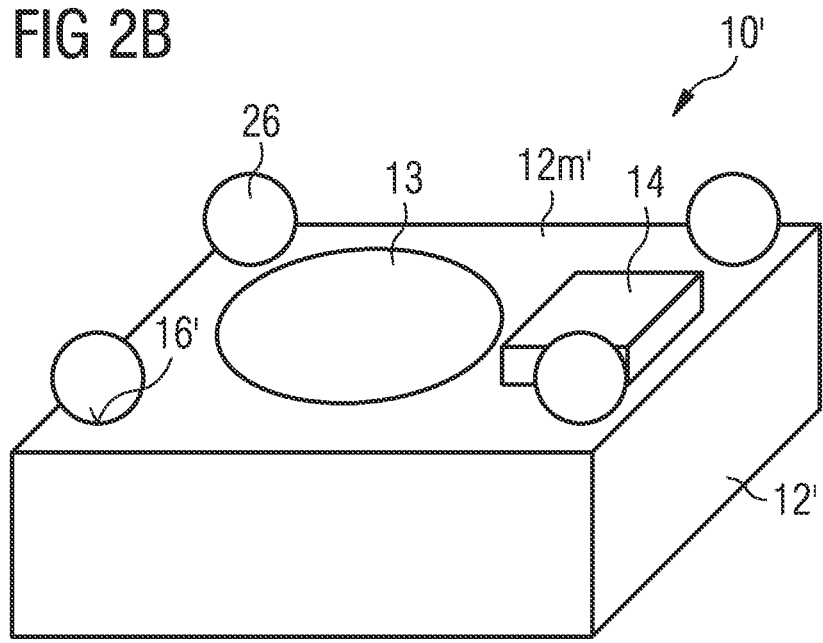
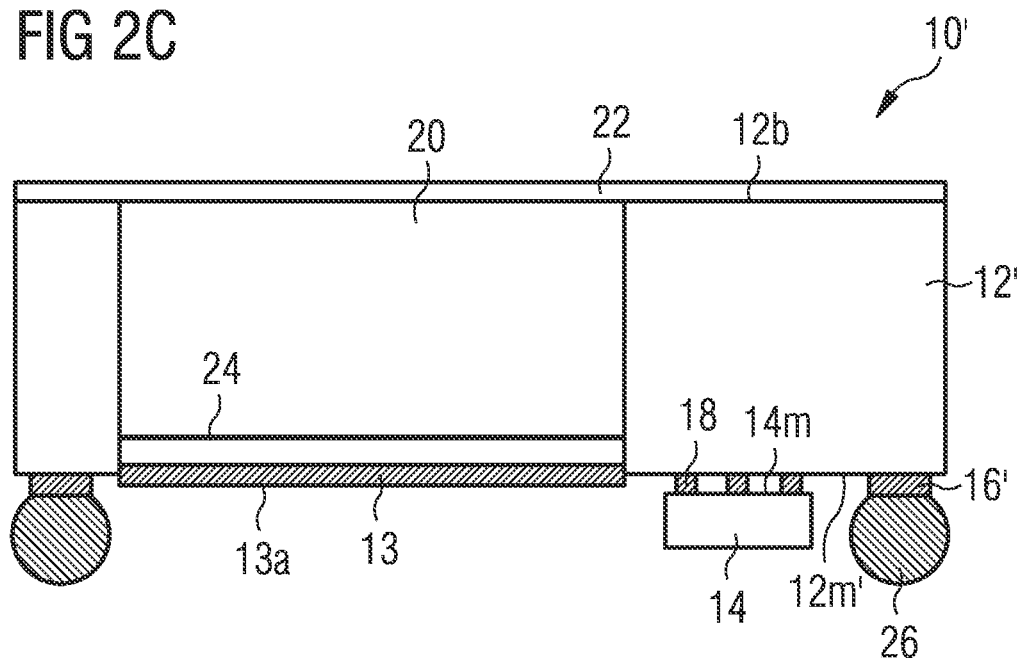

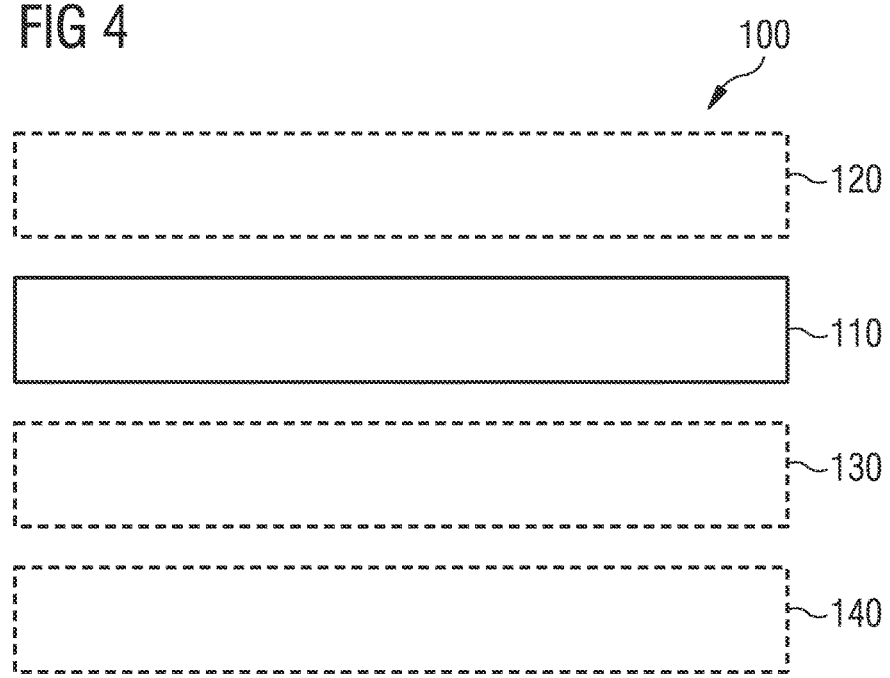
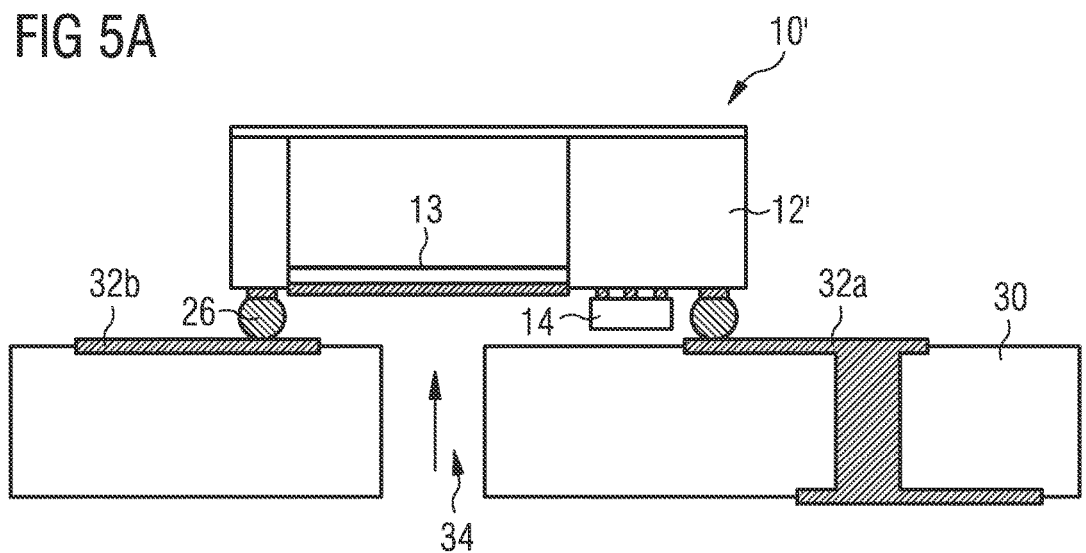

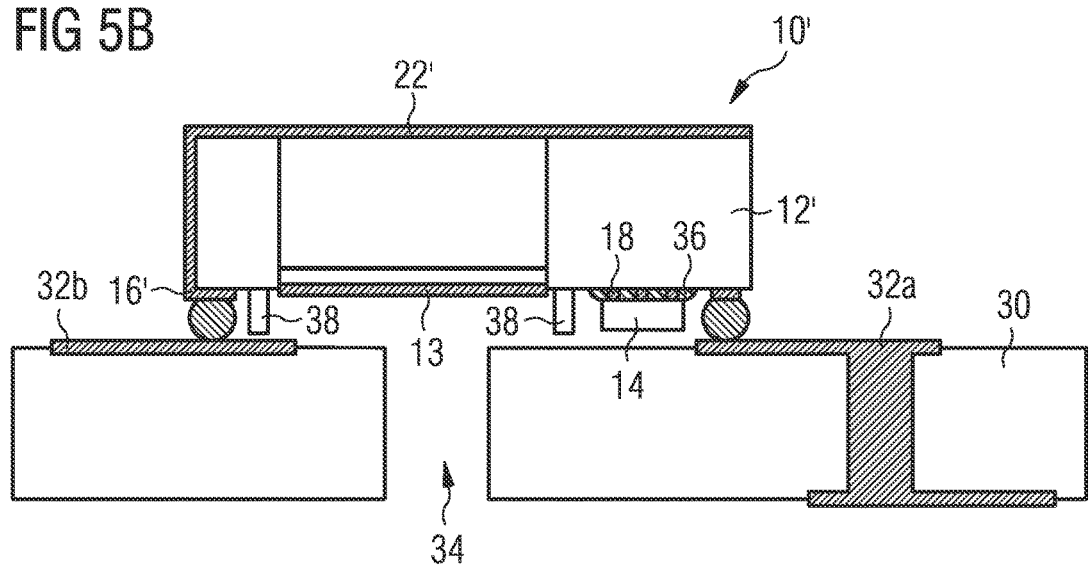
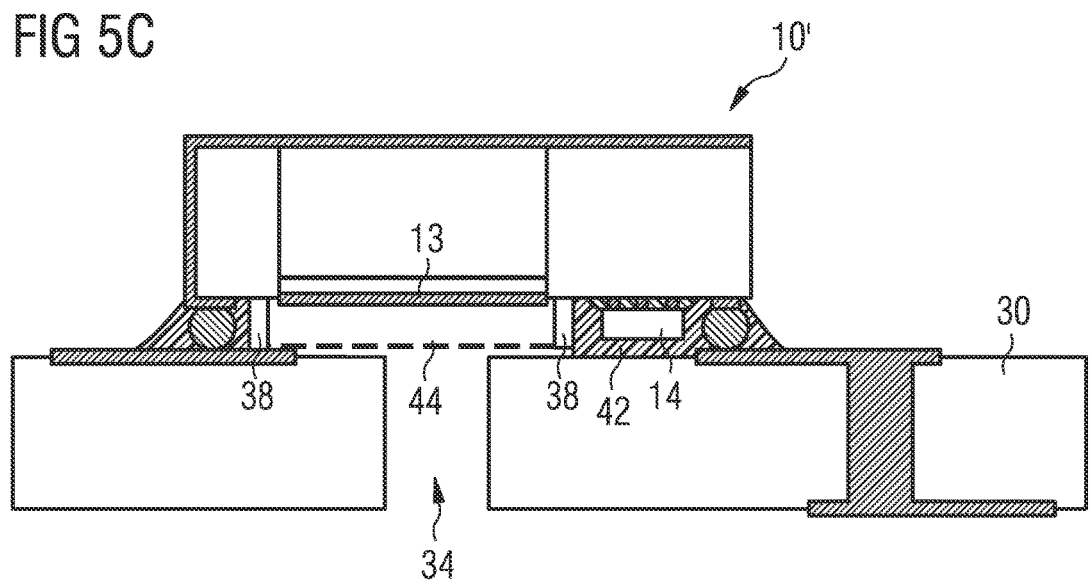

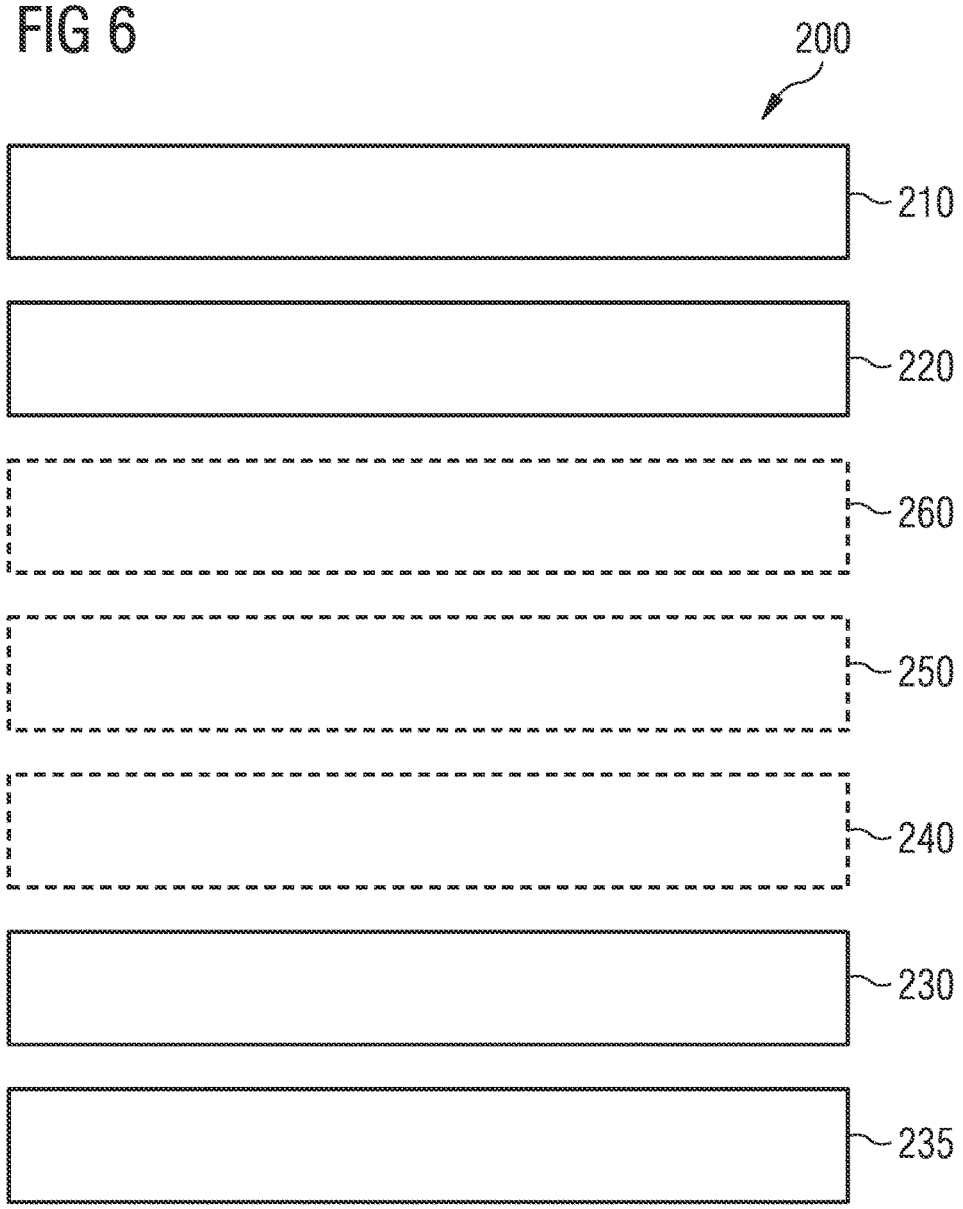

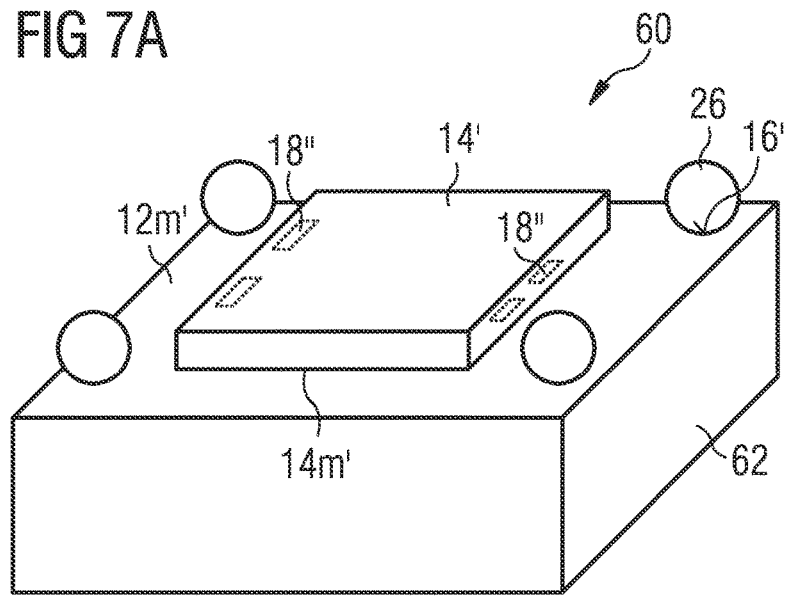
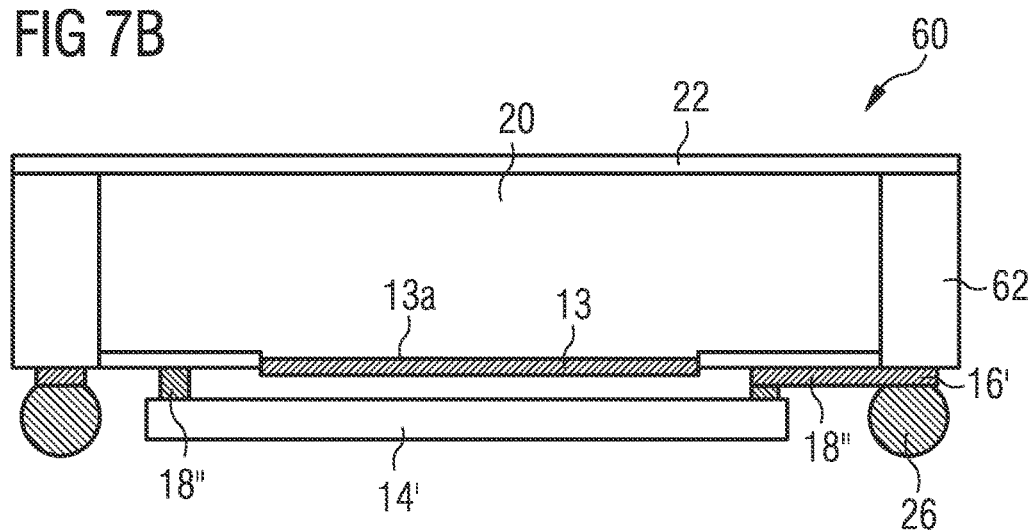

MEMS DEVICE

TECHNICAL FIELD

Embodiments of the present invention refer to MEMS devices and to different methods for manufacturing MEMS devices.

BACKGROUND

MEMS (Micro-Electro-Mechanical Systems) are miniaturized devices, typically fabricated by using semiconductor technologies and configured to interact with the surroundings. Application of such devices are sensors, like a pressure sensor, or actors, like the piezoelectric of an inkjet printer, or microphones, e.g., for mobile applications. A MEMS microphone system typically comprises a vibratory membrane having a first electrode (e.g., formed as a metalized membrane), and a counter electrode facing to the first electrode. Due to the two electrodes an acoustical signal resulting in a vibration of the membrane may capacitively be detected. The membrane typically has a small thickness, e.g., less than 200 nm or less than 100 nm, in order to have a good vibrational behavior. The membrane may be fabricated by using etching technology, namely in the way that a substrate is locally opened and thinned up to the wanted thickness of the membrane. A MEMS microphone typically comprises a back volume formed behind the membrane and acoustically coupled to same.

For common MEMS applications like microphone arrangements the MEMS chip is combined with a further chip, e.g., a controller, like an ASIC (Application Specific Integrated Circuit), FPGA, ADC or another chip which may comprise a CPU. Thus, a common MEMS device typically comprises a MEMS chip and an ASIC, both arranged on a common substrate and enclosed within a housing. These two chips are typically electrically connected by using bond wires. However, this solution limits the opportunities to miniaturize MEMS devices and causes high manufacturing efforts. Therefore, there is the need for an improved approach.

SUMMARY OF THE INVENTION

Embodiments of the invention provide a MEMS device, comprising a first chip and a MEMS chip. The first chip has a mounting surface and comprises at least an integrated circuit. The MEMS chip has a main surface, wherein a first set of contact pads for contacting the MEMS device and a second set of contact pads for contacting the first chip are arranged on the main surface. The first chip is mechanically attached and electrically connected to the second set of contact pads via the mounting surface facing the main surface. The mounting surface of the first chip is at least 25% smaller than the main surface of the MEMS chip.

A further embodiment provides a MEMS device comprising an ASIC and a MEMS chip. The ASIC has a mounting surface, wherein the MEMS chip has a main surface. The MEMS chip comprises a membrane arranged at the main surface, wherein a first set of contact pads for contacting the MEMS device to an external device (e.g., a PCB, Printed Circuit Board) and a second set of contact pads for contacting the MEMS chip to the ASIC via the mounting surface are arranged on the main surface. Here, the membrane lies adjacent to an area of the second set of contact pads. The ASIC is mechanically attached and electrically connected to the second set of contact pads by wafer bonding the mounting surface facing the main surface. The mounting surface of the ASIC is at least 50% smaller than the main surface of the MEMS chip.

A further embodiment provides a MEMS device comprising a first chip and a MEMS chip. The first chip comprises at least an integrated circuit and has a top surface and at least a sidewall. The MEMS chip has a main surface and also at least a sidewall. The first chip and the MEMS chip are mechanically attached to each other via the sidewalls of the first chip and of the MEMS chip such that the top surface and the main surface form a common surface. The first chip and the MEMS chip are electrically connected at the common surface via conductor lines.

According to a further embodiment the method for manufacturing a MEMS device, wherein the MEMS device comprises a first chip and a MEMS chip, the first chip having a mounting surface and comprising at least an integrated circuit, the MEMS chip having a main surface, on which a first set of contact pads for contacting the MEMS device and a second set of contact pads for contacting the first chip are arranged. The method comprises the step of mechanically attaching and electrically connecting the first chip to the second set of contact pads, wherein the mounting surface of the first chip is at least 25% smaller than the main surface of the MEMS chip.

A further embodiment provides a method for manufacturing a MEMS device comprising a first chip and a MEMS chip. The method comprises the steps of forming a plurality of the MEMS chips at a front side of a wafer and attaching a plurality of the first chips to the plurality of MEMS chips. Furthermore, the method comprises the step of attaching a further wafer to the backside of the wafer such that respective holes, each hole provided for the respective MEMS chip at the backside of the wafer, are covered by the further wafer in order to form a respective back volume for each MEMS chip. After that the wafer and the further wafer are diced in order to separate the plurality of MEMS devices.

BRIEF DESCRIPTION OF THE DRAWINGS

Below, embodiment of the present invention will subsequently be discussed referring to the enclosed figures, wherein:

FIGS. 2a to 2c show schematic views of a MEMS device comprising a MEMS chip and an ASIC attached to the MEMS chip according to an enhanced embodiment;

FIG. 4 shows a flow chart of a method for manufacturing a MEMS chip according to one of the embodiments shown by FIGS. 1 to 3;

FIGS. 5a to 5c show schematic cross-sectional views of applications of MEMS devices according to the embodiments of FIGS. 1 to 3;

FIG. 6 shows a flow chart of a method for manufacturing a MEMS device according to a further embodiment;

FIGS. 7a and 7b show schematic views of MEMS devices manufactured by using the method illustrated by FIG. 6 according to further embodiments.

Figure 1:
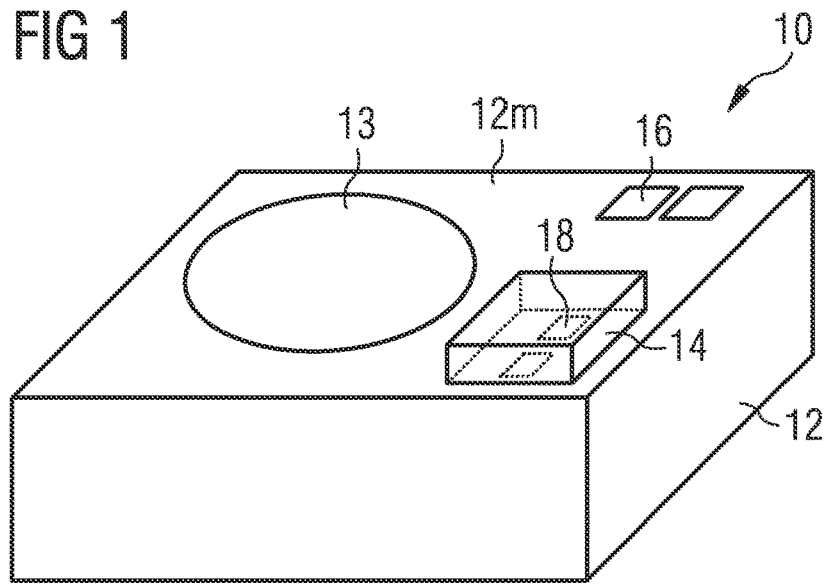
FIG. 1 shows a schematic view of the MEMS device comprising a MEMS chip and a first chip according to a first embodiment.

Different implementations of teachings disclosed herein will subsequently be discussed referring to FIGS. 1 to 8 below. Identical reference numbers are provided to objects having identical or similar functions so that objects referred to by identical reference numerals within different implementations are interchangeable and the description thereof is mutually applicable.

DETAILED DESCRIPTION OF ILLUSTRATIVE EMBODIMENTS

FIG. 1 shows an isometric view of a MEMS device 10 comprising a MEMS chip 12, for example a microphone, and a first chip 14, for example an ASIC or another chip comprising a logic or at least an integrated circuit, which may be used for controlling or biasing the MEMS chip 12. The MEMS chip 12 comprises a substrate and has at least two main surfaces, wherein the first main surface is marked by the reference numeral 12m. The MEMS chip 12 may comprise a vibratory membrane 13 which may be formed within the substrate or preferably on the main surface 12m. The MEMS chip 12 comprises a first set of contact pads 16 arranged at the main surface 12m. The first set of contact pads 16 has the purpose to connect the MEMS device 10 to an external device, for example to a PCB. The MEMS device 12 further comprises a second set of contact pads 18, which are also arranged at the main surface 12m and which have the purpose to electrically connect the ASIC 14. Each set of contact pads 16 and 18 may preferably comprise a plurality of contact pads, for example two or four contact pads.

As seen by FIG. 1, the first chip 14 is directly attached to the MEMS chip 12, e.g., by using flip chip technologies like wafer bonding. The chip 14 is consequently arranged within an area in which the second set of contact pads 18 is arranged. The flip chip or micro flip chip technology enables to realize a connection between two chips such that same are electrically connected and mechanically attached to each other. Thus, the second set of contact pads 18 is used for realizing the mechanical and electrical connection between the two chips 12 and 14. Therefore, the portion of the main surface 12m comprising the second set 18 is (preferably completely) covered by the chip 14.

FIG. 1 further shows that the chip 14 is substantially smaller than the MEMS chip 12 such that the chip 14 may be arranged on the main surface 12m. Here, the chip 14, e.g., having a size of 0.5×0.7 mm (0.6×0.6 mm), is at least 25% or 50% even smaller than the MEMS chip 12, e.g., having a size of 1.3×1.3 mm (1.0×1.0 mm). At least 25% means that the chip 14 has a maximum size of 75% of the MEMS device 14. According to the shown embodiment, the portion of the main surface 12m reserved for the chip 14 lies adjacent to the membrane 13. To create the additional space, the MEMS chip 12 may be enlarged by the portion of the chip 14. Below the line, such an arrangement 10 reduces the manufacturing costs due to the fact that the number of manufacturing steps (e.g., the bonding step for electrically connecting the ASIC to the MEMS chip via bond wires) is reduced. A further factor for reducing the manufacturing costs is that the cost intensive ASIC chip (see chip 14) may be designed as small as possible. In general, it should be noted that the shown MEMS device has a reduced space requirement when compared to the above described conventional MEMS device, even though the substrate of the MEMS chip 12 may have an increased base area when compared to one of a conventional MEMS device. This enables further miniaturization of MEMS devices. A further advantage of this approach is that there is no need for an additional housing formed by a cover so that the shown MEMS device 10 may directly be connected to the PCB of the application via the first set of connecting pads 16, for example to a PCB of a mobile phone.

Figure 2A:
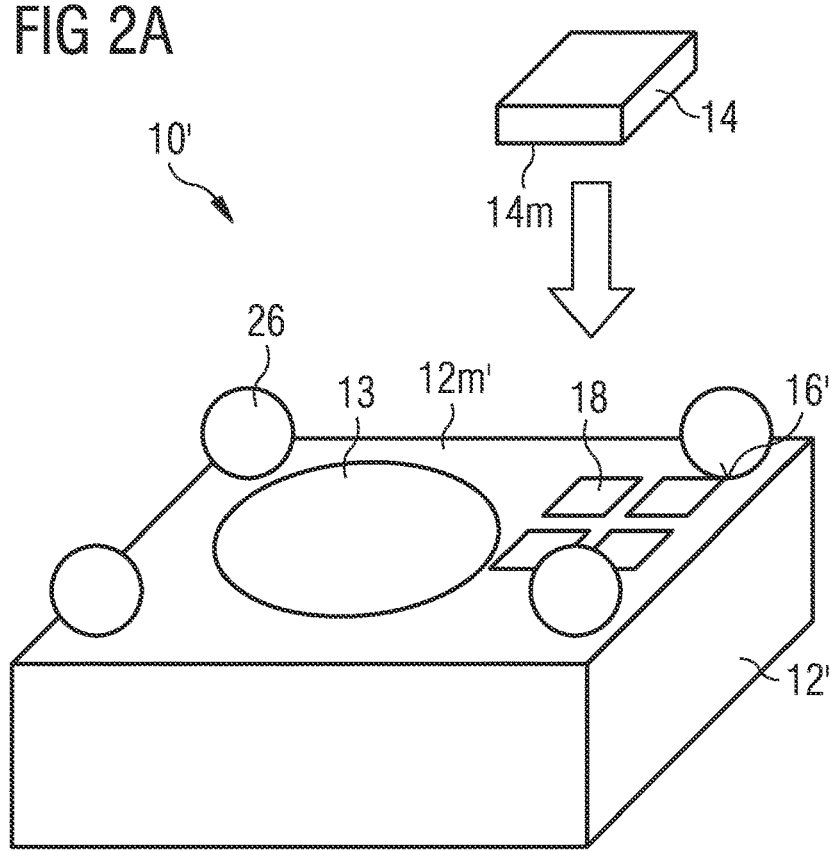

FIGS. 2a, 2b and 2c show a further MEMS device 10', wherein FIG. 2a illustrates the MEMS device 10' in an isometric manner during the manufacturing process, FIG. 2b shows the MEMS device 10' after finishing the manufacturing process (isometric view) and wherein FIG. 2c illustrates a cross-sectional view of the finished MEMS device 10'. The MEMS device 10' comprises a MEMS chip 12' comprising a round membrane 13 and the two sets of contact pads 18 and 16'. As illustrated by FIG. 2c, the MEMS chip 12' forms a back volume 20 which is limited by the membrane 13 on the side of the main surface 12m' and by the backside lid 22 of the backside 12b (opposing to the main surface 12m'). Furthermore, the counter electrode 24 may be arranged within the acoustical back volume 20 such that same faces to the first electrode 13a integrated into the membrane 30. For the sake of completeness, it should be noted that the back volume 20 is preferably provided from the backside 12b of the MEMS device 12' (i.e., opposing to the side at which the audio signal impinges) by backside etching, for example by using anisotropic etching technologies. The etched opening or trench extends up to a depth such that the thin membrane 13 is formed. The etching depths may be defined by using an etching stop layer arranged below the membrane 13. To sum up that means that the back volume 20 may be arranged within the substrate of the MEMS chip 12' and may be formed by the opening, which has been provided for thinning the substrate in order to form the membrane 13. The back volume lid 22 may cover the whole backside 12b of the MEMS 12'. The lid may comprise a metal or another conductive material if the lid 22 may serve as electromagnetic shield.

In this embodiment the connecting pads 16' are formed by solder balls 26 or are coupled to solder balls 26 such that the connecting pads 16' itself or the solder balls 26 protrude from the main surface 12m'. Alternatively, pins may be arranged instead of the solder balls 26 such that the pins protrude from the main surface 12m'. It should be noted that the connecting pad 16' and thus the solder balls 26 may be arranged distributed along the main surface 12m', for example within the four corners of the MEMS chip 12'. This has the advantage that in case of bonding the MEMS device 10' to an external device a known spacing between the external device and the main surface 12m' is defined such that a sound signal may impinge a membrane 13 without providing further means for determining the sound channel.

As shown by FIG. 2a, the connecting pads 18 are arranged adjacent to the membrane 13 as discussed with respect to FIG. 1. The area defined by the connecting pads of the first set 18 serves the purpose of being connected to the mounting surface 14m of the chip 14. This step of attaching the chip 14 via its mounting surface 14m to the MEMS chip 12', or in more detail to the portion of the main surface 12m' in which the contact pads 18 are arranged is illustrated by FIG. 2a (see arrow). For this connection the chip 14 comprises so called flip chip bumps arranged on the mounting surface 14m. The result of this step of attaching the chip 14 is shown by FIGS. 2b and 2c. Here, it is illustrated that the mounting surface 14m is connected to the main surface 12M' via the connecting pads 18. FIG. 2c further shows that an overall panel thickness defined by the thickness of the chip 14 and of the connecting pads 18 is smaller than the spacing defined by the connecting pads 16' together with the solder balls 26.

This enables that the MEMS device 10' may be directly attached to the external device without the need for a recess in the external device (for the chip 14). A thickness of the chip 14 is at least 50% smaller than a thickness of the MEMS chip 12'.

Figure 3A:
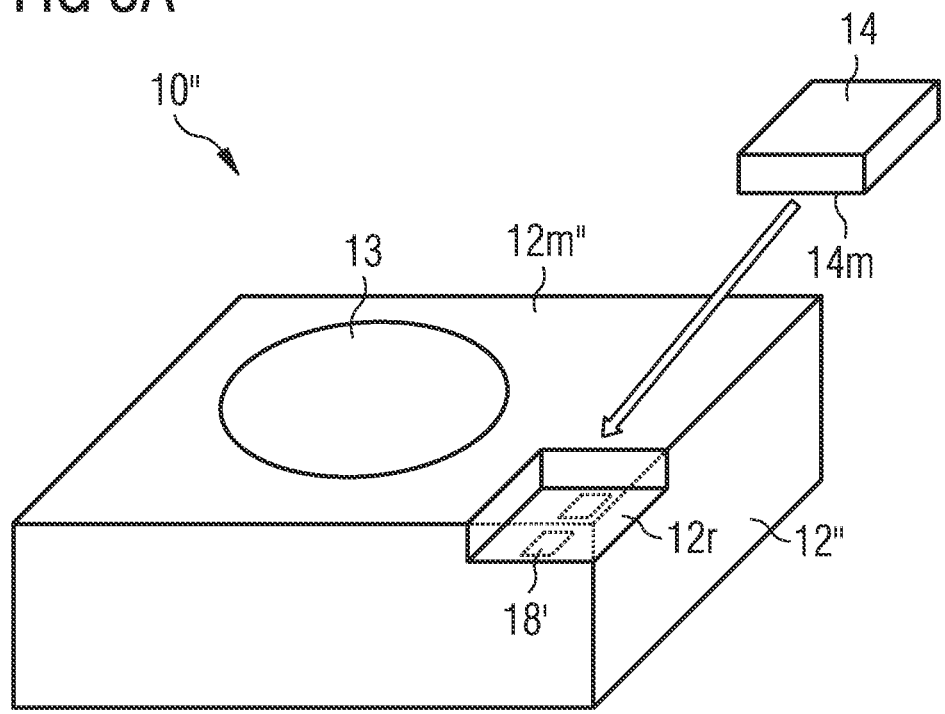
FIGS. 3a and 3b show schematic views of a MEMS device comprising MEMS chip and an ASIC embedded into the MEMS chip according to an enhanced embodiment.
Figure 3B:
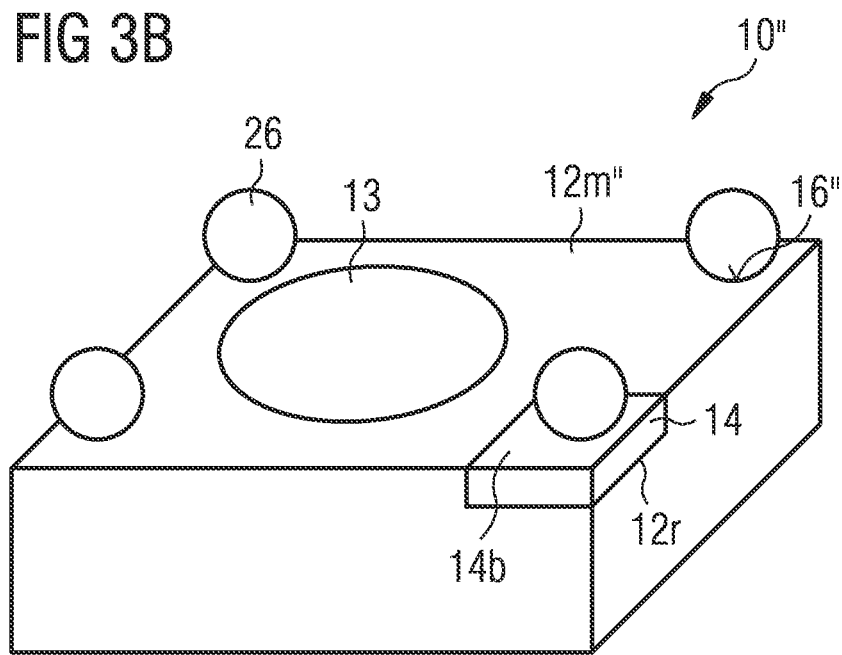

FIGS. 3a and 3b show a further MEMS device 10", wherein FIG. 3a shows an isometric view of same during manufacturing process, while FIG. 3b shows a completely manufactured MEMS device 10". In this embodiment the MEMS chip 12" comprises a recess 12r in which the chip 14 should be embedded. Here, the recess 12r is arranged at the corner, but may also alternatively be arranged anywhere within the main surface 12m" (besides the membrane 13). The recess 12r may, for example, be formed by using etching technologies. The recess 12r comprises a lower surface on which the contact pads 18" of the second set are arranged, such that the chip 14 may be connected (electrically and mechanically) via the mounting surface 14m. In this special case the size of the recess 12a is substantially equal to the size of the chip 14. After embedding the first chip 14 into the recess 12r the backside 14b of the chip 14 and the main surface 12m" of the chip 12" form a common surface. As illustrated by FIG. 3b, the first set of conducting pads 16" are arranged on the common surface (i.e., on the main surface 12m" of the chip 12" and/or at least partially on the backside surface 14b of the chip 14. As illustrated, each of the contact pads 18" comprises a solder ball 26. The providing of these solder balls 26 may be done during a step after embedding the chip 14 into the recess 12r (here FIG. 3a).

According to an alternative solution the contact pads 18" for contacting the chip 14 may also be arranged on the main surface 12m", namely on one of the edges of the recess 12r, if the electrical connection to the chip 14 should be realized by using conductor lines. The conductor lines may be deposited as interconnectors between the MEMS 12" and the chip 14.

Below, the method for manufacturing such MEMS devices will be discussed referring to FIG. 4, wherein a distinction between mandatory and optional steps is made.

FIG. 4 shows a flow chart illustrating the method for manufacturing one of the above discussed MEMS devices 10, 10' or 10". The central step of the method 100 is the step 110 of mechanically attaching and electrically connecting the first chip 14 to the second set of contact pads 18, 18' or 18". As discussed above, this step 110 may be done by using flip chip technologies like wafer bonding. Alternatively, the ASIC 14 may be attached to the MEMS chip 12 by using gluing technologies, e.g., conductive glue.

The method 100 may additionally comprise a step of forming the MEMS chip 12. This optional step is marked by the reference numeral 120 and chronologically arranged before the central step 110. The step 120 may comprise several substeps, e.g., lithography, etching and/or depositing. It should be noted that typically several MEMS chips are formed in parallel on a wafer which is diced afterwards.

Thus, the method 100 may comprise an additional step 140 of dicing in order to separate the plurality of MEMS chips. This step 140 may be arranged somewhere in the flow chart, e.g., before attaching the chip to the MEMS chip, but preferably at the end of the method.

A further optional manufacturing step of providing the solder balls 130 or pins to the connecting pads of the first set may succeed the central step 110. In the discussed method 100 comprising the steps 110 and 120, the step 130 may be performed after the step 120, but before dicing the wafer 140. Note that the step 130 may alternatively be done after the step 140.

FIG. 5a shows an application of the MEMS device 10' discussed with respect to FIGS. 2a to 2c. Here, the MEMS device 10' is arranged on an external device 30, for example on an external substrate or a PCB. The external substrate comprises its own connector pads 32a and 32b, e.g., conductor lines and/or through contacts to which the MEMS device 10' is electrically and mechanically connected via the solder balls 26. As can be seen, the interconnectors and the solder balls 26, respectively, are large enough so that the ASIC chip 14 attached to the MEMS chip 12' may be placed within the interspace between the MEMS device 10' and the external device 30'. In this application, the external device 30 has an opening 34 extending through same. The opening 34 forms a sound channel (inlet for sound) for the membrane 13 and thus is arranged aligned with the membrane 13.

FIG. 5b shows another application of FIG. 5a comprising the MEMS device attached to the external device 30. Here, the ASIC chip 14 is additionally connected to MEMS chip 12' by using an underfill 36 surrounding the contact pads 18. Furthermore, the membrane 13 is surrounding by a pre-applied structure 38, which may comprise a photoresist and may have the form of a ring. This pre-applied structure 38 has the purpose to protect the membrane 13 during the assembly process, e.g., because of flux contamination during the solder process. Furthermore, with respect to the underfill 36 the pre-applied structure 38 stops the underfill 36 covering the membrane 13. The shown application may have another optional feature, namely the conductive lid 22' which is connected to ground, e.g., via one of the connecting pads 16'. The grounded conductive lid 22' may have the purpose to shield the MEMS device 10' against environmental EMC errors.

FIG. 5c shows a further application of the MEMS device 10' of FIG. 5b, wherein the connection between the MEMS device 10' and the external device 30 is differently implemented. Here, the space between the MEMS device 10' and the external device 30 is filled with an additional underfill 42 at least in the areas in which the membrane 13 is not arranged. Consequently, the additional underfill 42 is arranged such that same surrounds the ASIC 14. The separation of the area in which the underfill 42 is provided and the area without the underfill 42 is done by using the structure 38. It should be noted that the underfill 42 may extend over the footprint of the MEMS device 10'. In this embodiment a further aspect is shown, namely a cavity 44 protecting the membrane 13. The cavity 44 may comprise a photoresist. In order to allow the sound signal impinging the membrane 13 from the front side, the cavity 44 may comprise one or more holes of may be perforated at least in the area of the sound channel 34.

Below, with respect to FIG. 6, a further method for manufacturing 200 will be discussed which is a further development of the above shown method 100. The method 200 comprises the central step of forming the plurality of MEMS chips at a front side of the wafer (see step marked by the reference numeral 210) and the step of attaching a plurality of diced first chips or ASICs to the plurality of MEMS chips (see step marked by 220). During the step 210 the wafer is processed such that a plurality of MEMS devices are fabricated on same in parallel, i.e., the intermediate product of the step 210 is a wafer comprising a plurality of MEMS chips. The step 220 is performed as discussed above, namely such that the mechanical and the electrical connection between the two chips is achieved.

Here, the plurality of ASIC chips 14 may be arranged onto the wafer in series or in parallel (simultaneously, e.g., by using positioning means).

After this step 220 a further mandatory step 230 follows, namely the step of attaching a further wafer to the backside of the wafer in order to provide the lid (see item 22 in FIG. 2c) for the plurality of MEMS chips. It should be noted that between the steps 220 and 230 optional steps may be arranged, which will be discussed below. The step 230 has the purpose to close holes which have been provided to the backside of the MEMS chips before (in order to form the back volumes 20, see FIG. 2c). Here, the entire backside of the first wafer is covered by the one further wafer so that all holes of the respective MEMS chips are provided to the wafer are closed during this one step 230. The intermediate product of the step 230 is a wafer stack comprising two wafers, namely one comprising the plurality of MEMS chips, wherein a plurality of ASIC chips is bonded to same and one arranged at the backside of the first wafer for forming the respective back volumes of the MEMS chips. The wafer arranged on the backside may typically be thinner when compared to the wafer comprising the MEMS chips.

The last mandatory step is the step 235 of dicing the wafer stack. The dicing may be performed by using stealth dicing or saw dicing or another dicing technology.

As discussed above, the plurality of holes are provided before the step 230. This may be done directly before the step 230 or even before the step 210. The flow chart 220 is made on the assumption that the step of providing the holes for forming the back volume (see step 240) is done after processing the wafer (see step 210) and after attaching the plurality of ASIC to same (see step 220). That is, the optional step 240 is chronologically arranged between the steps 220 and 230. As discussed above, the step 240 may be based on etching technologies and thus comprise substeps like lithography and/or etching (backside etching, anisotropic etching). The etching may be done by use of a so called etching-stop-layer provided below the membrane 13. This providing of the etching-stop-layer may be done during the method step 210.

According to a further embodiment, a further optional step may be arranged before the step 230 or even before the step 240, namely the step 250 of rotating the first wafer in order to enable an easier handling of the wafer for the subsequent steps 240, 230.

Referring to FIG. 6 it should be noted that the step 230 may alternatively be performed after dicing 235, as discussed with respect to method 100.

The method 200 may comprise a further step 260 for providing the solder balls (FIG. 2, item 26) to the first set of contact pads. This step 260 may be done contemporaneously through the step 220 or preferably subsequent to the step 220 (i.e., before the step 250 of rotating).

By using the illustrated method 200 the above discussed embodiments of the MEMS devices 10, 10' and 10" as well as other MEMS devices may be manufactured. Such MEMS devices are illustrated by FIGS. 7a and 7b. FIG. 7a shows an isometric view while FIG. 7b shows a cross-sectional view of a MEMS device 60 comprising a MEMS chip 62 having a first set of contact pads 16' on which solder balls 26 are arranged (see FIG. 2) and a second set 18" of contact pads for contacting the ASIC 14'. In contrast to the embodiment of FIG. 2 the ASIC 14' is enlarged. The ASIC is larger than the membrane 13 and arranged on the main surface 12m' with its mounting surface 14m' such that same covers the membrane 13 having a certain distance to same. The enlarged ASIC 14' serves the purpose of protecting the membrane 13. Therefore, the contact pads of the second set 18" for contacting the ASIC 14' are arranged adjacent to the membrane or abutting the membrane. As illustrated by FIG. 7b, one of the contact pads of the second set 18" is directly connected to one of the contact pads of the first set 16'. This may, for example, be the ground contact. Regarding the further aspect like the electrode 13a, the back volume 20 or the lid 22, the MEMS device 60 is substantially equal to the MEMS device 10' of FIG. 2.

Figure 8:
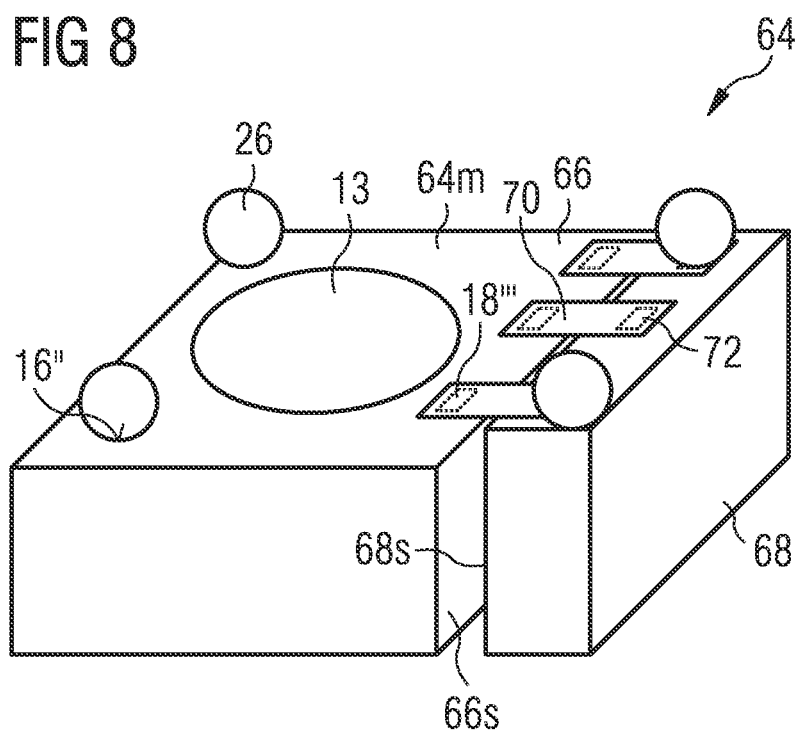
FIG. 8 shows a schematic view of the MEMS device comprising MEMS chip and a first chip arranged alongside the MEMS chip according to another embodiment.

FIG. 8 shows a further MEMS device 64 comprising a MEMS chip 66 and an ASIC 68. Both chips 66 and 68 are arranged side by side and are mechanically connected to each other via the respective sidewall 66s and 68s. Thus, the two chips 66 and 68 form a common main surface 64m (also referred to as top surface 64m). On this main surface 64m the membrane 13 as well as the contact pads of the first set 16" (see FIG. 3b) may be arranged (i.e., that the MEMS chip 66 and/or the ASIC chip 68 may comprise the contact pads 16"). The contact pads 16" may be formed by solder balls 26. The electrical connection between the two chips 66 and 68 is realized by conductor line 70 arranged at the main surface 64m. The conductor lines 70 connect the connecting pads 18''' arranged at the edge of the MEMS chip 66 and connecting pads 72 of the ASIC chip 68. Both connecting pads 18''' and 72 are arranged at the main surface 64m.

This MEMS device 64 has the same advantage discussed in context of FIG. 1, namely that the chip space, especially the cost intensive chip space of the ASIC 68 is reduced and that the MEMS device 64 may directly be used for further applications without the need of providing an additional housing.

According to an alternative embodiment, the membrane 13 may be arranged at the backside of the MEMS device 64 opposite to the main surface 64m. According to further embodiments, the contact pads 16" and thus the solder balls 26 may also be arranged at the backside. Consequently, the contact pads 16" may be realized as through contacts extending through the MEMS chip 66 and/or through the ASIC chip 68.

With respect to FIGS. 1 and 2 it should be noted that the MEMS structure (e.g., membrane 13) may alternatively be arranged at the backside (opposite to the main surface 12m) of the MEMEs chip 12.

Referring to FIG. 1, it should be noted that the size difference between the mounting surface 14m and the main surface 12m of the two chips 12 and 14 may be generalized such that the chip space requirement of the ASIC 14 is at least 25% or even 50% smaller than the chip space requirements of the MEMS chip. Consequently, the horizontal and vertical page dimensions of the ASIC chip 14 may be reduced by the discussed factor when compared to the horizontal and vertical page dimensions of the MEMS device 12.

With respect to the embodiments of FIGS. 1 and 2 it should be noted that ASIC 14 must not be rectangular, so same may have a triangular or another shape which fits better to the surface 12m of the MEMS die.

Referring to FIG. 2 it should be noted that the chip 14 also comprises an integrated circuit which is preferably formed at the mounting surface 14m below or adjacent to the flip chip bumps.

Although some aspects have been described in the context of an apparatus, it is clear that these aspects also represent a description of the corresponding method, wherein a blog or a device corresponds to a method step or a feature of a method step. Analogously, aspects described herein in context of a method step also represent a description of a corresponding blog or item or feature of a corresponding apparatus.

The above described embodiments are merely illustrative for the principle of the present invention. It is understood that modifications and variations of the arrangements and the details described herein will be apparent to other skilled in the art. It is the intent, therefore, to be limited only by the scope of the appended patent claims and not by the specific details presented by way of description and explanation of the embodiments herein.

What is claimed is:

1. A MEMS microphone comprising:
a first chip having a mounting surface and comprising at least an integrated circuit; and
a MEMS chip comprising:
a main surface;
a membrane located at the main surface;
a first set of contact pads for externally contacting the MEMS microphone; and
a second set of contact pads for contacting the first chip, wherein the first and second sets of contact pads are arranged on the main surface,
wherein the first chip is mechanically attached via the mounting surface facing the main surface and electrically connected to the second set of contact pads via the mounting surface, and
wherein the first chip is configured to control the MEMS microphone.

2. The MEMS microphone according to claim 1, wherein the mounting surface of the first chip is more than 25% smaller than the main surface of the MEMS chip.

3. The MEMS microphone according to claim 1, wherein a thickness of the first chip is at least 50% smaller than a thickness of the MEMS chip.

4. The MEMS microphone according to claim 1, wherein the membrane is arranged at the main surface.

5. The MEMS microphone according to claim 1, wherein the membrane is adjacent to an area of the second set of contact pads.

6. The MEMS microphone according to claim 4, wherein the MEMS chip comprises a backside lid arranged at a back side surface opposing the main surface.

7. The MEMS microphone according to claim 6, wherein a back volume is formed between the membrane and the backside lid by a trench extending from the back side surface.

8. The MEMS microphone according to claim 1, wherein the first chip comprises an ASIC.

9. The MEMS microphone according to claim 1, wherein the first chip and the MEMS chip are connected to each other by bonding.

10. The MEMS microphone according to claim 1, wherein an underfill is arranged between the first chip and the MEMS chip.

11. The MEMS microphone according to claim 1, wherein the first chip comprises a cut-out for the first chip, and wherein a lateral extension of the cut-out is larger or equal to the mounting surface of the MEMS chip.

12. The MEMS microphone according to claim 1, further comprising a plurality of solder balls arranged at the contact pads of the first set.

13. The MEMS microphone according to claim 12, wherein a thickness of the first chip is smaller than a dimension of the solder balls.

14. A MEMS microphone comprising:
an ASIC having a mounting surface; and
a MEMS chip having a main surface and comprises a membrane arranged at the main surface, wherein a first set of contact pads for contacting the MEMS microphone to an external device and a second set of contact pads for contacting the MEMS chip to the ASIC via the mounting surface are arranged on the main surface, wherein the membrane is adjacent to an area of the second set of contact pads,
wherein the ASIC is mechanically attached by bonding the mounting surface facing the main surface and electrically connected to the second set of contact pads by bonding the mounting surface, and
wherein the ASIC is configured to control the MEMS microphone.

15. The MEMS microphone according to claim 14, wherein the bonding is a flip chip bonding.

16. A MEMS device comprising:
a MEMS chip having a first main surface and a second main surface, the MEMS chip comprising:
a first set of contact pads located at the first main surface and configured to be connected to an external device;
a second set of contact pads located at the first main surface; and
a membrane located at the first main surface; and
a first integrated circuit chip having a mounting surface, the first integrated circuit chip configured to control the MEMS chip,
wherein the first integrated circuit chip is mechanically attached via the mounting surface to the main surface and electrically connected to the second set of contact pads via the mounting surface,
wherein the MEMS chip is a single, separate and individual chip, and wherein the first integrated circuit chip is a single, separate and individual chip.

17. The MEMS device according to claim 16, wherein the external device is printed circuit board (PCB).

18. The MEMS device according to claim 17, wherein the MEMS device is connected to the PCB via flip chip arrangement so that the first integrated chip is located between the MEMS chip and the PCB.

19. The MEMS microphone according to claim 14, wherein the MEMS chip comprises a single substrate, the single substrate comprising the main surface and the membrane formed in the single substrate.

* * * * *